(12) United States Patent
Hamasaki et al.

(10) Patent No.: US 10,120,275 B2
(45) Date of Patent: Nov. 6, 2018

(54) LAYOUT METHOD OF MASK PATTERN, MANUFACTURING METHOD OF A SEMICONDUCTOR DEVICE AND EXPOSURE MASK

(71) Applicant: TOSHIBA MEMORY CORPORATION, Minato-ku (JP)

(72) Inventors: Masakazu Hamasaki, Yokkaichi (JP); Yoshihiro Yanai, Yokkaichi (JP); Michiya Takimoto, Yokkaichi (JP); Naoki Sato, Yokkaichi (JP); Satoshi Usui, Nagoya (JP); Takaki Hashimoto, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 88 days.

(21) Appl. No.: 15/255,399

(22) Filed: Sep. 2, 2016

(65) Prior Publication Data

US 2017/0329887 A1    Nov. 16, 2017

Related U.S. Application Data

(60) Provisional application No. 62/335,279, filed on May 12, 2016.

(51) Int. Cl.

| | | |
|---|---|---|
| *G03F 1/36* | (2012.01) | |
| *G06F 17/50* | (2006.01) | |
| *H01L 21/033* | (2006.01) | |
| *H01L 21/027* | (2006.01) | |
| *H01L 21/311* | (2006.01) | |

(52) U.S. Cl.
CPC ............ *G03F 1/36* (2013.01); *G06F 17/5081* (2013.01); *H01L 21/0274* (2013.01); *H01L 21/0338* (2013.01); *H01L 21/31144* (2013.01)

(58) Field of Classification Search
CPC ..... G03F 1/36; G06F 17/5081; H01L 21/0338
USPC ...................................................... 430/5, 30
See application file for complete search history.

(56) References Cited

U.S. PATENT DOCUMENTS

| | | | |
|---|---|---|---|
| 7,694,267 B1 * | 4/2010 | Ye ............................ | G03F 1/144 716/53 |
| 7,803,503 B2 | 9/2010 | Yamayoshi | |
| 7,977,018 B2 | 7/2011 | Ogino et al. | |

FOREIGN PATENT DOCUMENTS

| | | |
|---|---|---|
| JP | 2000-75467 | 3/2000 |
| JP | 4896671 | 3/2012 |
| JP | 5217442 | 6/2013 |

* cited by examiner

*Primary Examiner* — Christopher G Young
(74) *Attorney, Agent, or Firm* — Oblon, McClelland, Maier & Neustadt, L.L.P.

(57) ABSTRACT

According to one embodiment, a layout region of a mask pattern is divided into N (N is an integer of 2 or larger) units, a main pattern resolved by exposure light is arranged and sub patterns not resolved by the exposure light are arranged outside the main pattern such that distributions of attenuation amount of the exposure light in the divided layout regions are different.

14 Claims, 8 Drawing Sheets

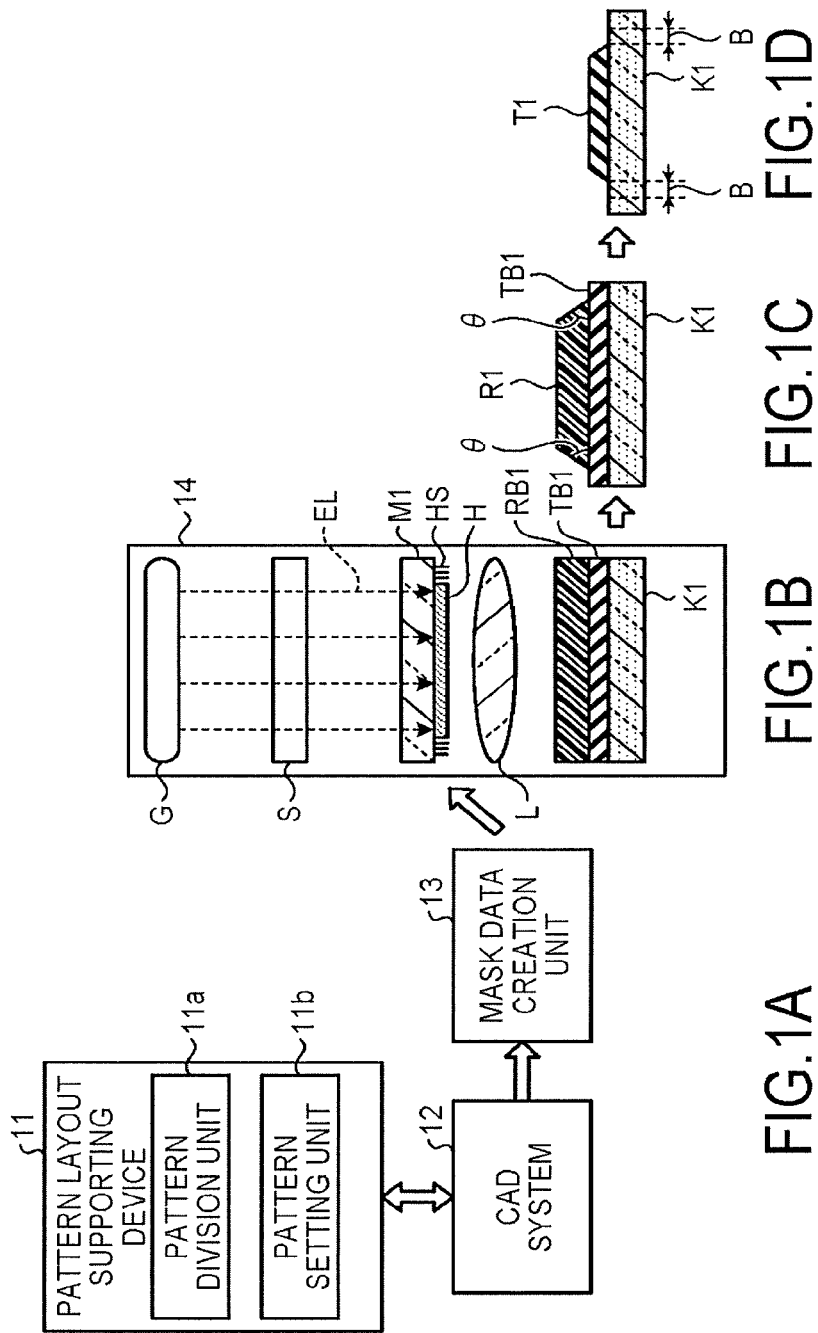

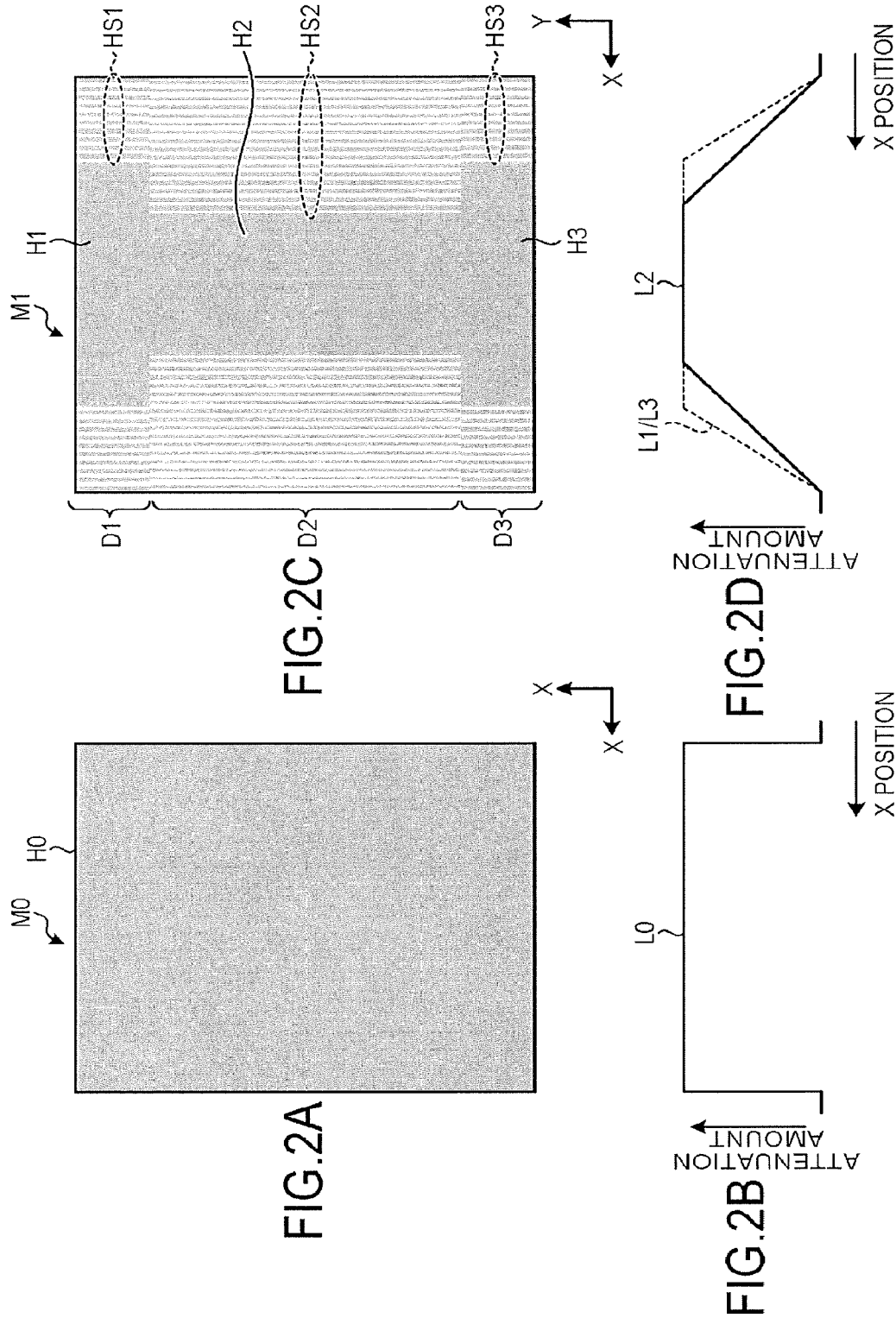

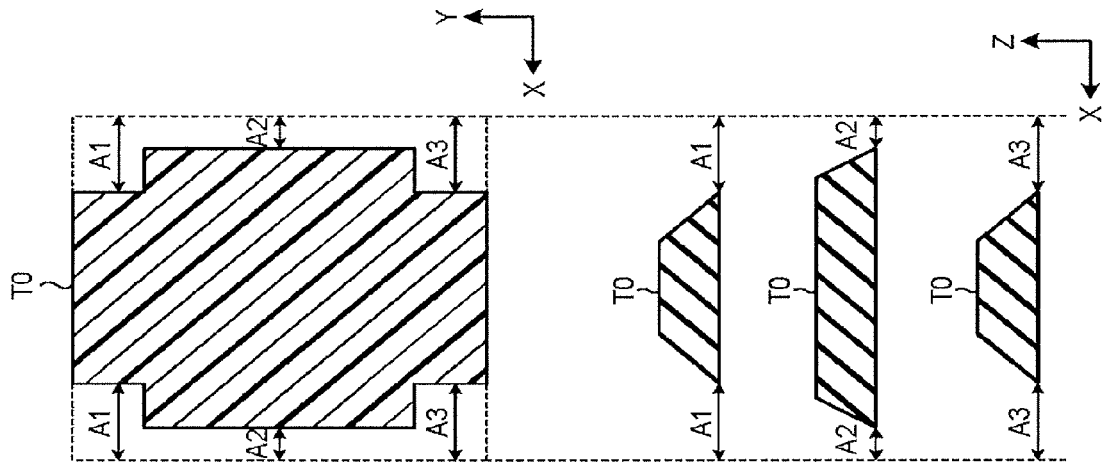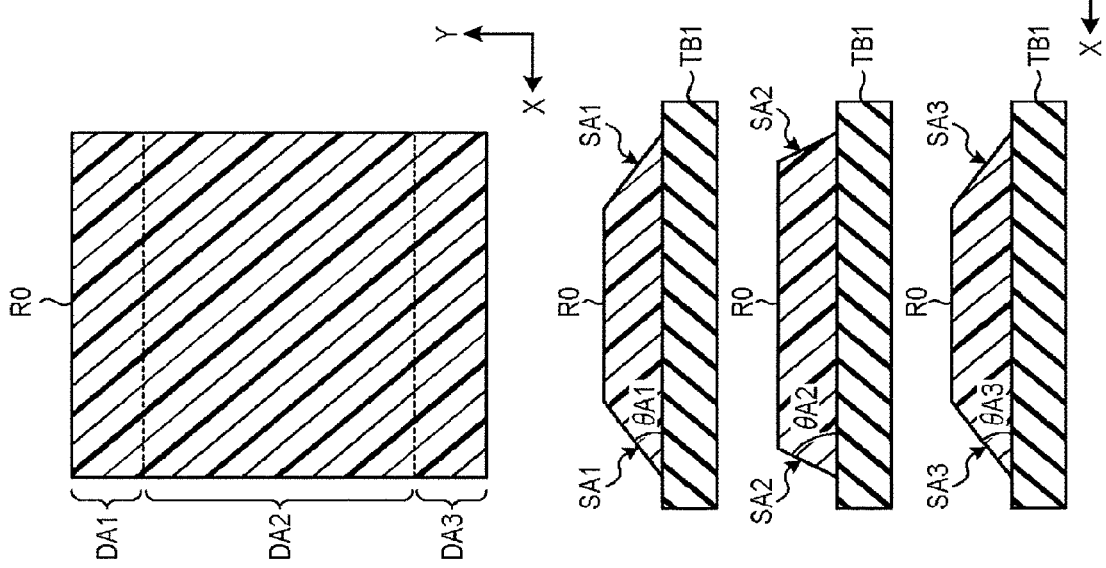

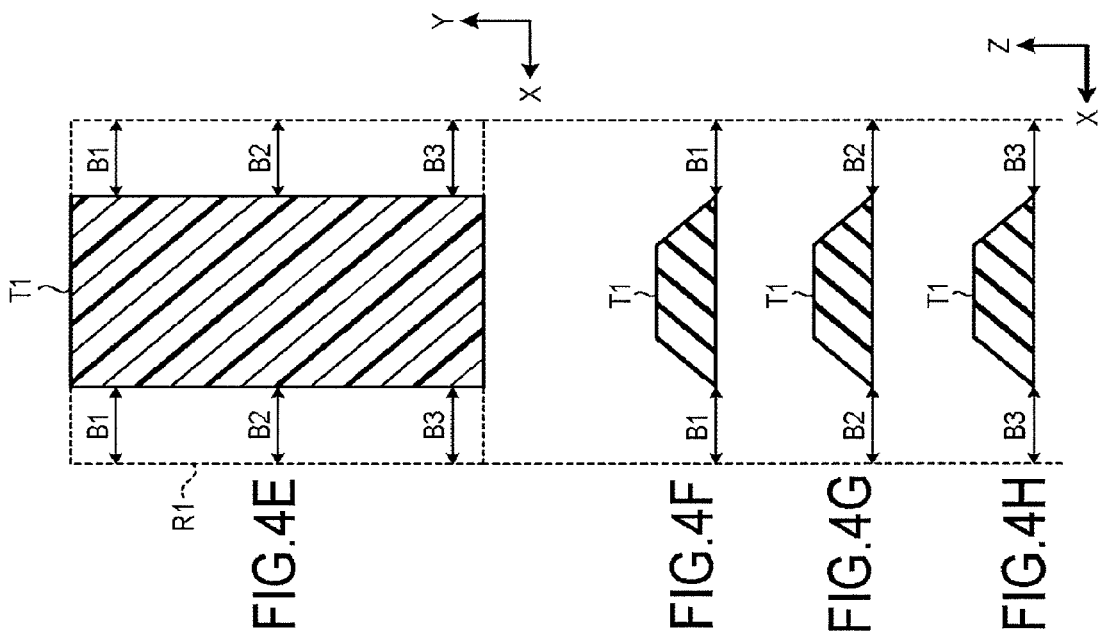
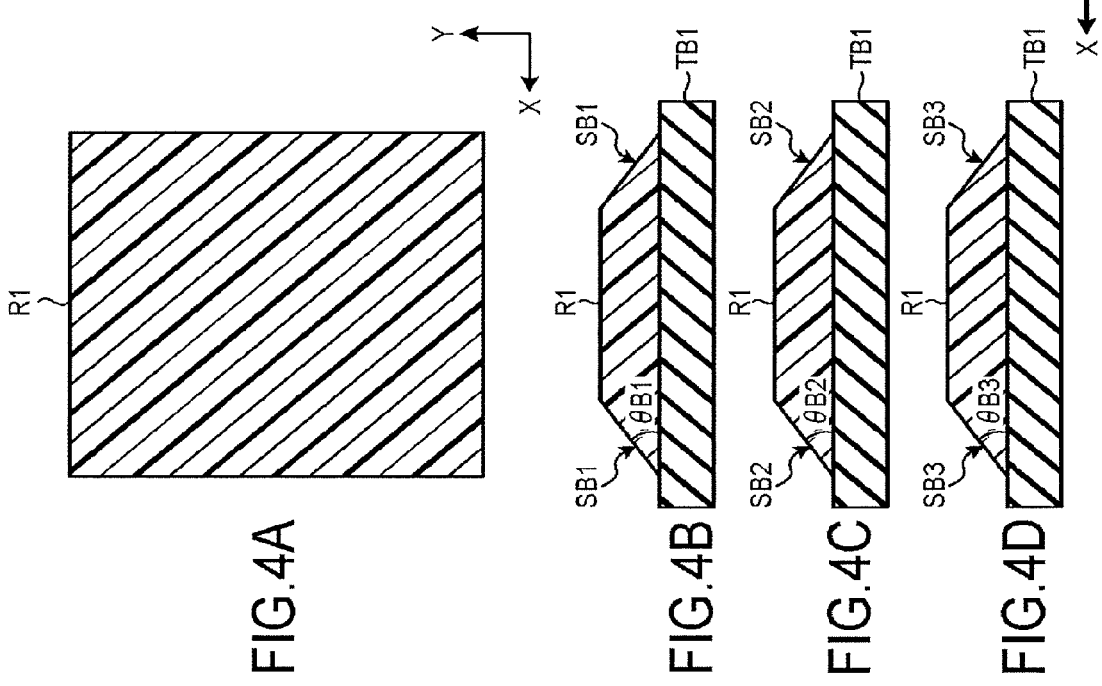

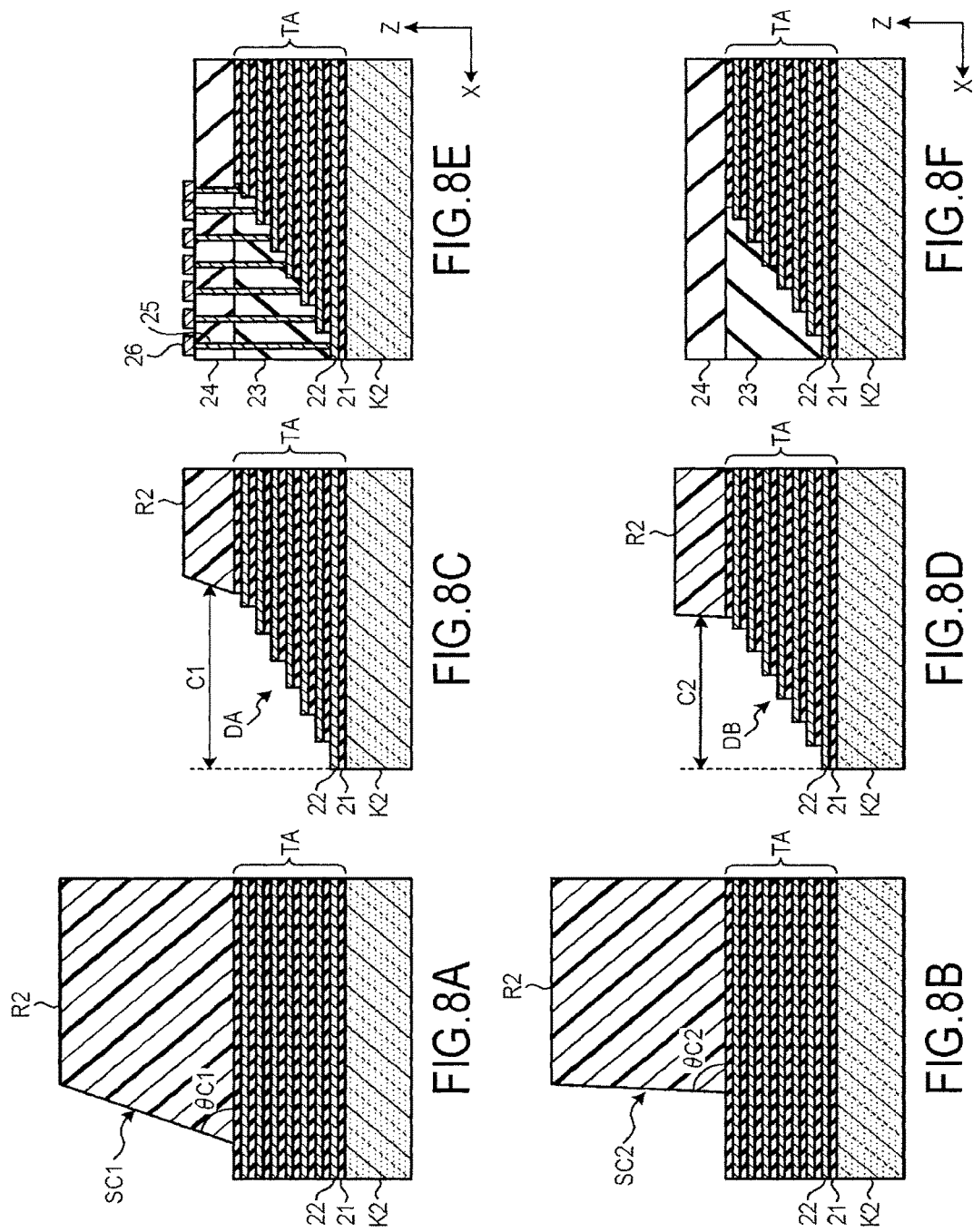

LAYOUT METHOD OF MASK PATTERN, MANUFACTURING METHOD OF A SEMICONDUCTOR DEVICE AND EXPOSURE MASK

CROSS-REFERENCE TO RELATED APPLICATIONS

This application is based upon and claims the benefit of priority from U.S. Provisional Application No. 62/335,279, filed on May 12, 2016; the entire contents of which are incorporated herein by reference.

FIELD

Embodiments described herein relate generally to a layout method of mask pattern, a manufacturing method of a semiconductor device, and an exposure mask.

BACKGROUND

In a lithography process, variations in the cross section shape of a resist pattern may deteriorate uniformity of dimensions of a processing film.

BRIEF DESCRIPTION OF THE DRAWINGS

FIG. 1A is a schematic block diagram of a pattern layout supporting device according to a first embodiment and its peripheral devices, FIG. 1B is a schematic cross-sectional view of an exposure device in which the pattern layout supporting device illustrated in FIG. 1A is used, FIG. 1C is a cross-sectional view of a step after formation of a resist pattern, and FIG. 1D is a cross-sectional view of a step after formation of a processed pattern;

FIG. 2A is a plane view of a configuration example of a mask pattern before division according to the first embodiment, FIG. 2B is a diagram illustrating the relationship between X position of the mask pattern illustrated in FIG. 2A and the amount of attenuation, FIG. 2C is a plane view illustrating a configuration example of the mask pattern after division according to the first embodiment, and FIG. 2D is a diagram illustrating the relationship between X position of the mask pattern illustrated in FIG. 2C and the amount of attenuation;

FIG. 3A is a plane view of a shape of a resist pattern using an exposure mask illustrated in FIG. 2A, FIGS. 3B to 3D are cross-sectional views of shapes of divided regions of the resist pattern illustrated in FIG. 3A, FIG. 3E is a plane view of a shape of a processed pattern using the resist pattern illustrated in FIG. 3A, and FIGS. 3F to 3H are cross-sectional views of shapes of divided regions of the processed pattern illustrated in FIG. 3E;

FIG. 4A is a plane view of a shape of a resist pattern using an exposure mask illustrated in FIG. 2C, FIGS. 4B to 4D are cross-sectional views of shapes of divided regions of the resist pattern illustrated in FIG. 4A, FIG. 4E is a plane view of a shape of a processed pattern using the resist pattern illustrated in FIG. 4A, and FIGS. 4F to 4H are cross-sectional views of shapes of divided regions of the processed pattern illustrated in FIG. 4E;

FIGS. 8A to 8F are cross-sectional views of a manufacturing method of a semiconductor device according to a third embodiment.

DETAILED DESCRIPTION

Figure 5:
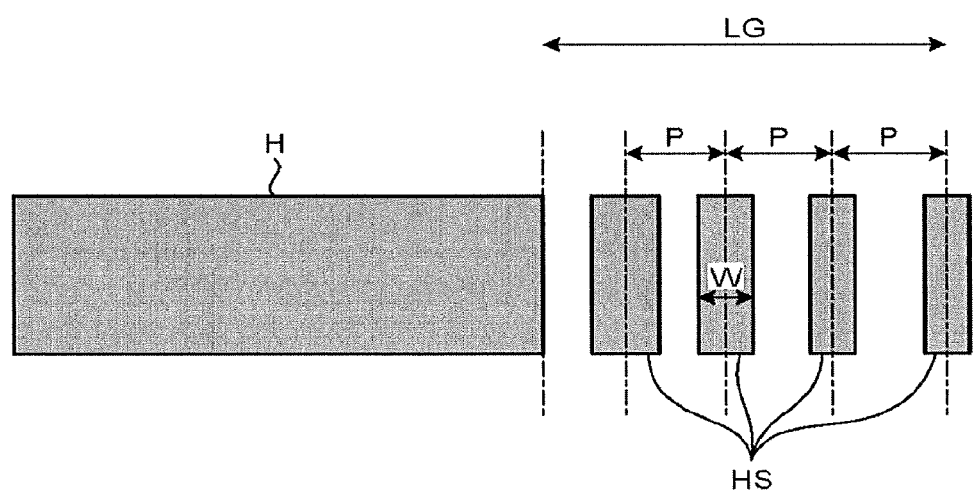
FIG. 5 is a plane view illustrating parameters for sub patterns for use in the mask pattern after division according to the first embodiment.

In general, according to one embodiment, a layout method of mask pattern includes dividing a layout region of a mask pattern into N (N is an integer of 2 or larger) units, arranging a main pattern resolved by exposure light and arranging sub patterns not resolved by the exposure light outside the main pattern such that distributions of attenuation amount of the exposure light in the divided layout regions are different.

Exemplary embodiments of a layout method of mask pattern and a manufacturing method of a semiconductor device will be explained below in detail with reference to the accompanying drawings. The present invention is not limited to the following embodiments.

(First Embodiment)

FIG. 1A is a schematic block diagram of a pattern layout supporting device according to a first embodiment and its peripheral devices, FIG. 1B is a schematic cross-sectional view of an exposure device in which the pattern layout supporting device illustrated in FIG. 1A is used, FIG. 1C is a cross-sectional view of a step after formation of a resist pattern, and FIG. 1D is a cross-sectional view of a step after formation of a processed pattern.

Referring to FIG. 1A, a pattern layout supporting device 11 is provided with a pattern division unit 11a and a pattern setting unit 11b. Peripheral devices of the pattern layout supporting device 11 include a CAD system 12 and a mask data creation unit 13. Referring to FIG. 1B, an exposure device 14 includes a light source G, a diaphragm S, an exposure mask M1, and a lens L.

The pattern division unit 11a divides a layout region of a mask pattern of the exposure mask M1 into N units. The pattern setting unit 11b sets arrangement positions of a main pattern H resolved by exposure light EL and sub patterns HS not resolved by the exposure light EL. The sub patterns HS may be sub resolution assist features (SRAF). The sub patterns HS can be different in distribution of attenuation amount of the exposure light EL among the divided layout regions. The sub patterns HS can have lines and spaces alternately and repeatedly arranged on both sides of the main pattern H, for example.

The resolution with a wavelength of the exposure light EL of 365 nm (i line) and a numerical aperture NA of 0.65 is 350 nm. The wavelength with a wavelength of the exposure light EL of 248 nm (KrF) and a numerical aperture NA of 0.66 is 90 nm. The resolution with a wavelength of the exposure light EL of 193 nm (ArE) and a numerical aperture NA of 0.93 is 65 nm. The resolution with a wavelength of the exposure light EL of 193 nm (ArE) and a numerical aperture NA of 1.35 is 38 nm.

The CAD system 12 creates design layout data for a semiconductor integrated circuit. The pattern division unit 11a divides the layout region of the mask pattern into N units. Further, the pattern setting unit 11b sets arrangement positions of the main pattern H and the sub patterns HS in the respective divided layout regions, and sends the setting data to the mask data creation unit 13.

Then, the mask data creation unit 13 creates mask data corresponding to the main pattern H and the sub patterns HS set for the individual divided layout regions. The main pattern H and the sub patterns HS specified by the mask data created by the mask data creation unit 13 are formed from light-shielding films on the exposure mask M1.

Meanwhile, as illustrated in FIG. 1B, a processing film TB1 is formed on a foundation layer K1, and a resist film RB1 is applied to the processing film TB1. The foundation layer K1 and the processing film TB1 may be semiconductor substrates, insulation films such as silicon oxide films or silicon nitride films, semiconductor films of amorphous silicon or polycrystalline silicon, or metallic films of Al, Cu, or the like. The processing film TB1 may be a stacked body in which a plurality of layers is stacked.

The light source G emits the exposure light EL. The exposure light EL is narrowed down by the diaphragm S and enters the resist film RB1 through the exposure mask M1 and the lens L to expose the resist film RB1 to the light.

Next, as illustrated in FIG. 1C, after the light exposure of the resist film RB1, the resist film RB1 is developed to form a resist pattern R1 on the processing film TB1. The sub patterns HS can define the cross-sectional shape of the resist pattern R1. For example, arranging the sub patterns HS on both sides of the main pattern H can define a taper angle θ of end portions of the resist pattern R1. The taper angle θ can be adjusted by adjusting the width, pitch, and number of the sub patterns HS.

Next, as illustrated in FIG. 1D, the processing film TB1 is etched with the resist pattern R1 as a mask to form a processed pattern T1. At this time, the processed pattern T1 has a process conversion difference B. The process conversion difference B is the difference between the edge position of the resist pattern R1 and the edge position of the processed pattern T1. The process conversion difference B can be adjusted by adjusting the taper angle θ.

A division method of the layout region of the mask pattern and a layout method of the sub patterns HS in the individual divided layout regions will be explained below specifically. In the first embodiment, the layout region of the mask pattern is divided into three as an example.

FIG. 2A is a plane view of a configuration example of the mask pattern before division according to the first embodiment, FIG. 2B is a diagram illustrating the relationship between X position of the mask pattern illustrated in FIG. 2A and the amount of attenuation, FIG. 2C is a plane view illustrating a configuration example of the mask pattern after division according to the first embodiment, and FIG. 2D is a diagram illustrating the relationship between X position of the mask pattern illustrated in FIG. 2C and the amount of attenuation.

Referring to FIG. 2A, an exposure mask M0 before the division of the layout region has a mask pattern H0 formed thereon. The mask pattern H0 can be a solid pattern to be resolved by the exposure light EL. As illustrated in FIG. 2R, in a distribution L0 of attenuation amount of the exposure mask M0, the amount of attenuation of the exposure light EL rises steeply at the edge position in the mask pattern H0.

FIG. 3A is a plane view of a shape of a resist pattern using the exposure mask illustrated in FIG. 2A, FIGS. 3B to 3D are cross-sectional views of shapes of individual divided regions of the resist pattern illustrated in FIG. 3A, FIG. 3E is a plane view of a shape of a processed pattern using the resist pattern illustrated in FIG. 3A, and FIGS. 3F to 3H are cross-sectional views of shapes of individual divided regions of the processed pattern illustrated in FIG. 3E. FIGS. 3F to 3H correspond to the positions of FIGS. 3B to 3D.

Referring to FIG. 3A, lithography is performed with the use of the exposure mask M0 illustrated in FIG. 2A to form a resist pattern R0 on the processing film TB1. At this time, an inclined surface SA1 with a taper angle θA1 is formed at the edge of the resist pattern R0 in a region DA1, an inclined surface SA2 with a taper angle θA2 is formed at the edge of the resist pattern R0 in a region DA2, and an inclined surface SA3 with a taper angle θA3 is formed at the edge of the resist pattern R0 in a region DA3. In this case, the relationship θA2>θA1=θA3 can hold.

Next, as illustrated in FIGS. 3E to 3H, the processing film TB1 is etched via the resist pattern R0 to form a processed pattern T0. At this time, the processed pattern T0 has a process conversion difference A1 corresponding to the inclined surface SA1 of the resist pattern R0, a process conversion difference A2 corresponding to the inclined surface SA2 of the resist pattern R0, and a process conversion difference A3 corresponding to the inclined surface SA3 of the resist pattern R0. When θA2>θA1=θA3, A2<A1=A3. Accordingly, when lithography is performed with the use of the exposure mask M0 illustrated in FIG. 2A, the process conversion differences A1 to A3 generated in the processed pattern T0 vary between the region DA2 and the regions DA1 and DA3.

Therefore, the resist pattern R0 is divided into the regions DAT to DA3 according to the process conversion differences A1 to A3 and the layout region of the mask pattern is divided in correspondence with the dividing positions in the resist pattern R0. Then, the sub patterns are arranged in the individual divided respective layout regions such that the process conversion differences are equal among the regions DA1 to DA3.

Specifically, referring to FIG. 2C, the layout region of the mask pattern on the exposure mask M1 is divided into the regions D1 to D3. The regions D1 to D3 of the exposure mask M1 can correspond to the regions DA1 to DA3 of the resist pattern R0, respectively. A main pattern H1 is arranged in the region D1, and sub patterns HS1 are arranged on the both sides of the main pattern H1. The sub patterns HS1 can be symmetrically arranged with respect to the main pattern H1.

A main pattern H2 is arranged in the region D2, and sub patterns HS2 are arranged on the both sides of the main pattern H2. The sub patterns HS2 can be symmetrically arranged with respect to the main pattern H2. A main pattern H3 is arranged in the region D3, and sub patterns HS3 are arranged on the both sides of the main pattern H3. The sub patterns HS3 can be symmetrically arranged with respect to the main pattern H3.

The main patterns H1 to H3 can solid patterns to be resolved by the exposure light EL. The arrangement densities of the sub patterns HS1 to HS3 in the regions D1 to D3 can be lower with decreasing proximity to the edges of the main patterns H1 to H3. The number of the sub patterns HS2 arranged in the region D2 can be larger than the numbers of the sub patterns HS1 and HS3 in the regions D1 and D3. The regions D1 and D3 can be symmetrically arranged with respect to the region D2.

As illustrated in FIG. 2D, in the distributions L1 to L3 of attenuation in the exposure mask M1, the amount of attenuation of the exposure light EL rises with an inclination at the edge position of the mask pattern. The inclination of the rise in the distributions L1 and L3 of attenuation in the regions D1 and D3 is larger than that in the distribution L2 of attenuation in the region D2.

FIG. 4A is a plane view of a shape of a resist pattern using the exposure mask illustrated in FIG. 2O, FIGS. 48 to 4D are cross-sectional views of shapes of individual divided regions of the resist pattern illustrated in FIG. 4A, FIG. 48 is a plane view of a shape of a processed pattern using the resist pattern illustrated in FIG. 4A, and FIGS. 4F to 4H are cross-sectional views of shapes of individual divided regions of the processed pattern illustrated in FIG. 4B. FIGS. 4F to 4B correspond to the positions of FIGS. 4B to 4D, respectively.

Referring to FIG. 4A, lithography is performed with the use of the exposure mask M1 illustrated in FIG. 2C to form a resist pattern R1 on the processing film TB1. At this time, an inclined surface SB1 with a taper angle θB1 is formed at the edge of the resist pattern R1 corresponding to the region D1 of the exposure mask M1, an inclined surface SB2 with a taper angle θB2 is formed at the edge of the resist pattern R1 corresponding to the region D2 of the exposure mask M1, and an inclined surface SB3 with a taper angle θB3 is formed at the edge of the resist pattern R1 corresponding to the region D3 of the exposure mask M1. In this example, the relationship θB1=θB2=θB3 can hold.

Next, as illustrated in FIGS. 4E to 4H, the processing film TB1 is etched via the resist pattern R1 to form a processed pattern T1. The processed pattern T1 has a process conversion difference B1 corresponding to the inclined surface SB1 of the resist pattern R1, a process conversion difference B2 corresponding to the inclined surface SB2 of the resist pattern R1, and a process conversion difference B3 corresponding to the inclined surface SB3 of the resist pattern R1. When θB1=θB2=θB3, A1=A2=A3. Accordingly, when lithography is performed with the use of the exposure mask M1 illustrated in FIG. 2C, the process conversion differences generated in the processed pattern T1 can be equal among the regions DA1 to DA3.

FIG. 5 is a plane view illustrating parameters for sub patterns for use in the mask pattern after division according to the first embodiment.

Referring to FIG. 5, when the sub patterns HS are arranged on the both sides of the main pattern H, a distance LG from the edge position of the main pattern H and width W and pitch P of the sub patterns HS can be adjusted. The width W and pitch P of the sub patterns HS can be set such that the sub patterns HS are not resolved. The width W of the sub patterns HS can be smaller with decreasing proximity to the edge position of the main pattern H.

By adjusting the distance LG from the edge position of the main pattern H, the width W and pitch P of the sub patterns HS, the taper angle θ of the edge position of the resist pattern R1 and the process conversion difference B can be adjusted.

Figure 6:
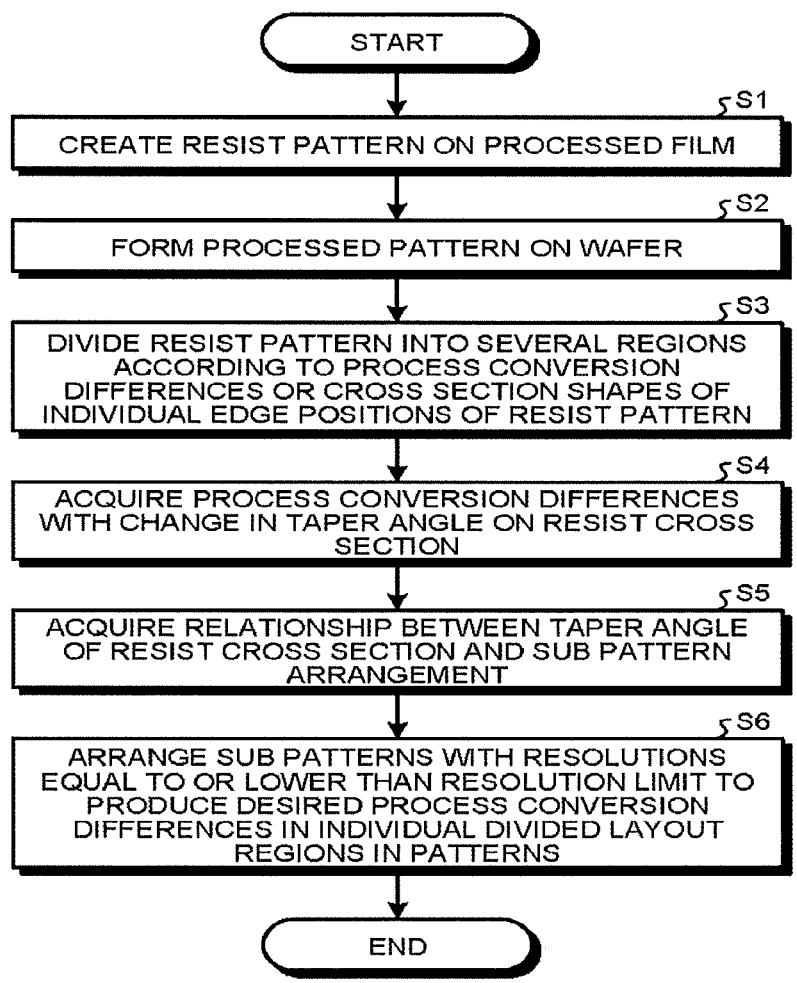
FIG. 6 is a flowchart of a layout method of mask pattern according to the first embodiment.

FIG. 6 is a flowchart of a layout method of masks pattern according to the first embodiment.

Referring to FIG. 6, lithography is performed with the use of an exposure mask before the division of a layout region to form a resist pattern on a processing film (S1).

Next, the processing film is etched via the resist pattern to form a processed pattern on a wafer (S2).

Next, the resist pattern is divided into several regions depending on the process conversion differences or cross-sectional shapes of the resist pattern at the individual edge positions (S3).

Next, process conversion differences with a change in the taper angle of the resist cross section are acquired (S4). The process conversion differences with a change in the taper angle of the resist cross section may be determined by simulation or may be measured under different experimental conditions such that the taper angle of the resist cross section changes.

Next, the relationship between the taper angle of the resist cross section and the arrangement method of the sub patterns is acquired (S5). The relationship between the taper angle of the resist cross section and the arrangement method of the sub patterns may be determined by simulation or may be actually measured with changes in the arrangement method of the sub patterns. At this time, as illustrated in FIG. 5, the taper angle of the edge position of the resist pattern can be adjusted by adjusting the distance LG from the edge position of the main pattern H and the width N and pitch P of the sub patterns HS.

Next, the layout region of the mask pattern is divided in correspondence with the dividing positions in the resist pattern. Then, the sub patterns with a resolution equal to or less than the resolution limit to produce the desired process conversion differences are arranged in the individual divided layout regions (S6). At this time, a maximum value Δm of the process conversion differences in the individual regions obtained by dividing the resist pattern at S3 is used as a reference.

Then, the sub patterns can be arranged in the regions with the process conversion differences Δx other than the region with the maximum value Δm to compensate for the difference Δm−Δx between the maximum value Δm and the process conversion differences Δx in the regions. The maximum value Δm of the process conversion difference is used as a reference because the sub patterns can be arranged to increase the process conversion differences but the sub patterns cannot be arranged to decrease the process conversion differences.

Accordingly, it is possible to reduce variations in the process conversion differences at the edge positions of the processed pattern without changing the dimensions of the resist pattern.

(Second Embodiment)

Figure 7:
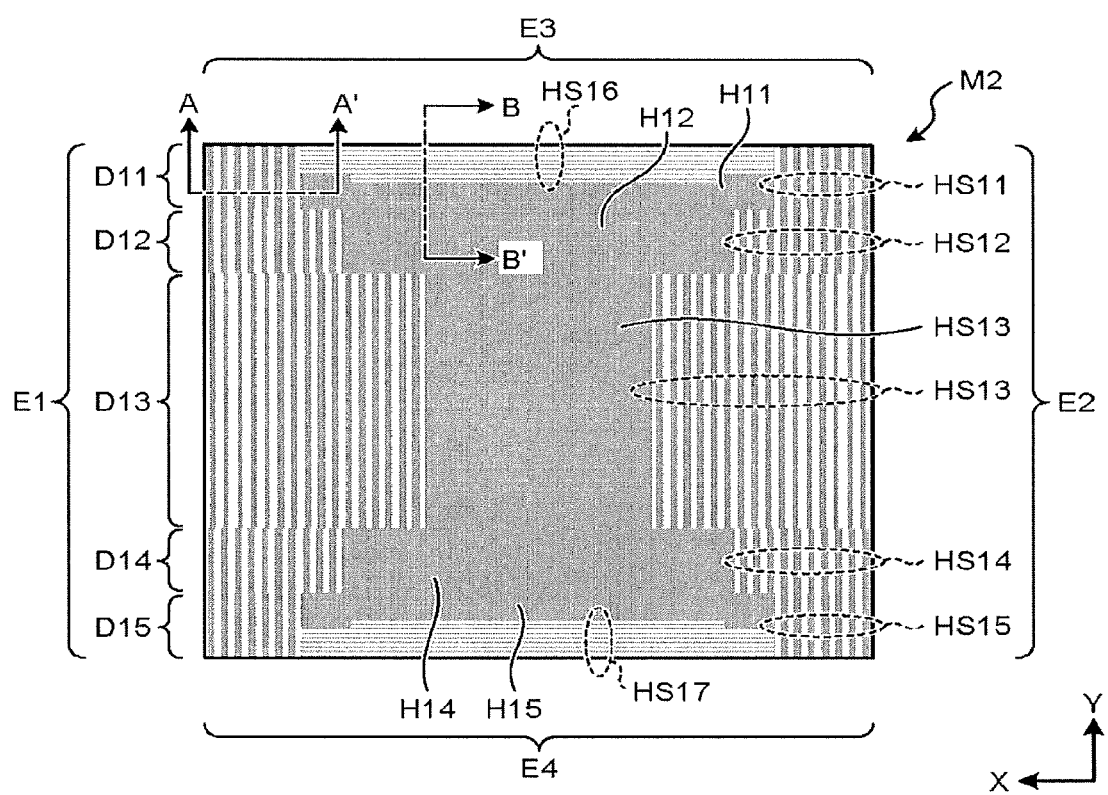
FIG. 7 is a plane view of a configuration example of a mask pattern according to a second embodiment.

FIG. 7 is a plane view of a configuration example of a mask pattern according to a second embodiment. In the second embodiment, the layout region of the mask pattern is divided into five as an example.

Referring to FIG. 7, in an exposure mask M2, the layout region of the mask pattern is divided into regions D11 to D15. The exposure mask M2 includes four sides E1 to E4. The regions D12 to D14 have the two sides E1 and E2 at end portions, the region D11 has the three sides E1 to E3 at the end portions, and the region D15 has the three sides E1, E2, and E4 at the end portions.

A main pattern H11 is arranged in the region D11 and sub patterns HS11 are arranged on both sides of the main pattern H11. The sub patterns HS11 can be symmetrically arranged with respect to the main pattern H11. In addition, sub patterns HS16 are arranged on the side E3 of the region D11. A main pattern H12 is arranged in the region D12 and sub patterns HS12 are arranged on both sides of the main pattern H12. The sub patterns HS12 can be symmetrically arranged with respect to the main pattern H12.

A main pattern H13 is arranged in the region D13 and sub patterns HS13 are arranged on both sides of the main pattern H13. The sub patterns HS13 can be symmetrically arranged with respect to the main pattern H13. A main pattern H14 is arranged in the region D14 and sub patterns HS14 are arranged on both sides of the main pattern H14. The sub patterns HS14 can be symmetrically arranged with respect to the main pattern H14. A main pattern H15 is arranged in the region D15 and sub patterns HS15 are arranged on both sides of the main pattern H15. The sub patterns HS15 can be symmetrically arranged with respect to the main pattern H15. In addition, sub patterns HS17 are arranged on the side of E4 of the region D15.

The main patterns H11 to H15 can be solid patterns to be resolved by the exposure light EL. The arrangement density of the sub patterns HS11 to HS15 in the regions D11 to D15 can be lower with decreasing proximity to the edges of the main patterns H11 to H15. The numbers of the sub patterns HS12 and HS14 arranged in the regions D12 and D14 can be larger than the numbers of the sub patterns HS11 and HS15 arranged in the regions D11 and D15.

The number of the sub patterns HS13 arranged in the region U13 can be larger than the numbers of the sub patterns HS12 and HS14 arranged in the regions D12 and D14. The numbers of the sub patterns HS16 and HS17 arranged in the regions D11 and D15 can be smaller than the numbers of the sub patterns HS11 and HS15. The regions D11 and D15 can be symmetrically arranged with respect to the regions D12 to D14. The regions D12 and D14 can be symmetrically arranged with respect to the region D13.

By making the numbers of the sub patterns HS16 and HS17 arranged in the regions D11 and D15 smaller than the numbers of the sub patterns HS11 and HS15, the inclination angle of the edge positions of the resist pattern on the sides E3 and E4 can be smaller than the inclination angle of the edge positions of the resist pattern on the sides E1 and E2. Accordingly, the process conversion difference on the sides E3 and E4 can be smaller than that on the sides E1 and E2, thereby decreasing the amount of recession of the processed pattern on the sides E3 and E4 as compared to that on the sides E1 and E2.

(Third Embodiment)

FIGS. 8A to 8F are cross-sectional views of a manufacturing method of a semiconductor device according to a third embodiment. FIGS. 8A, 8C, and 8E are cross-sectional views corresponding to line A-A' of FIG. 7, and FIGS. 8B, 6D, and 8F are cross-sectional views corresponding to line B-B' of FIG. 7.

Referring to FIGS. 8A and 8B, a stacked body TA is formed on a foundation layer K2. The stacked body TA has inter-layer insulation films 21 and conductive films 22 alternately stacked. For example, the material for the inter-layer insulation films 21 can be $SiO_2$, and the material for the conductive films 22 can be a metal such as W or a polycrystalline silicon, or the like.

Lithography is performed with the use of the exposure mask M2 illustrated in FIG. 7 to form a resist pattern R2 on the stacked body TA. At this time, an inclined surface SC1 with a taper angle θC1 is formed at the edge of the resist pattern R2 on the side E1 of the exposure mask M2, and an inclined surface 3C2 with a taper angle θC2 can be formed at the edge of the resist pattern R2 on the side E3 of the exposure mask M2. In this case, the relationship θC2>θC1 can hold.

Next, as illustrated in FIGS. 8C and 8D, each time one each of the inter-layer insulation films 21 and the conductive films 22 is etched, the resist pattern R2 is repeatedly slimmed to form steps DA and DB in the stacked body TA. At this time, the upper inter-layer insulation films 21 and conductive films 22 are receded relative to the lower inter-layer insulation films 21 and conductive films 22 to expose the lower conductive films 22 from the upper inter-layer insulation films 21 and conductive films 22. By establishing the relationship θC2>θC1, a terrace size C2 of the steps DB can be smaller than a terrace size C1 of the steps DA.

Next, as illustrated in FIGS. 8E and 8F, an insulation film 23 is embedded in the steps DA and DB to flatten the steps DA and DB.

Next, an insulation film 24 is formed on the insulation film 23 and the stacked body TA by a method such as CVD. Then, contact plugs 25 are embedded into the insulation films 23 and 24 so as to be in contact with the individual conductive films 22. Then, wires 26 connected to the contact plugs 25 are formed on the insulation film 24.

By making the terrace size C2 of the steps DB smaller than the terrace size C1 of the steps DA, it is possible to reduce the chip size while maintaining the contact region.

In addition, by dividing the layout region of the mask pattern into the regions D11 to D15 and arranging the sub patterns HS11 to HS15 in the region D11 to D15, respectively, the inclination angles at the edge positions of the resist pattern R2 on the sides E1 and E2 can be equal. Accordingly, even when the stacked body TA is etched while the resist pattern R2 is repeatedly slimmed, it is possible to reduce variations in the process conversion differences at the edge positions of the individual layers in the stacked body TA.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A layout method of mask pattern, comprising:
   dividing a layout region of a mask pattern into N (N is an integer of 2 or larger) units; and
   arranging a main pattern resolved by exposure light and arranging a periodic structure of sub patterns not resolved by the exposure light outside the main pattern such that distributions of attenuation amount of the exposure light in the divided layout regions are different each other.

2. The layout method of mask pattern of claim 1, wherein the sub patterns are arranged on both sides of the main pattern, and
   the numbers of the sub patterns are different in the adjacent divided layout regions.

3. The layout method of mask pattern of claim 1, wherein when the layout region is in an XY plane, the layout region is divided into N units in an X direction, and
   the sub patterns are symmetrically arranged in the X direction.

4. The layout method of mask pattern of claim 3, wherein the layout region is divided into N units in an X direction such that the divided layout regions are symmetric in a Y direction, and
   the layout regions symmetric in the Y direction of the divided layout regions are equal in distribution of attenuation amount of the exposure light.

5. The layout method of mask pattern of claim 1, wherein dividing positions in the layout region are set based on the difference between an edge position of a resist pattern with the use of the mask pattern before division of the layout region and an edge position of a processed pattern with the use of the resist pattern.

6. The layout method of mask pattern of claim 5, wherein the difference is adjusted by adjusting the width and pitch of the sub patterns.

7. The layout method of mask pattern of claim 1, wherein dividing positions in the layout region are set based on the cross section shape of the resist pattern with the use of the mask pattern before division of the layout region.

8. The layout method of mask pattern of claim 5, wherein the cross section shape is adjusted by adjusting the width and pitch of the sub patterns.

9. The layout method of mask pattern of claim 1, wherein
the sub patterns arranged in the layout regions with three sides at end portions of the divided layout regions include:
first sub patterns that are arranged on two sides opposed to one another; and
second sub patterns that are arranged on the one remaining side and are smaller in number than the first sub patterns.

10. An exposure mask, wherein
a layout region of a mask pattern is divided into N (N is an integer of 2 or larger) units; and
a main pattern resolved by exposure light is arranged and a periodic structure of sub patterns not resolved by the exposure light is arranged outside the main pattern such that distributions of attenuation amount of the exposure light in the divided layout regions are different.

11. The exposure mask of claim 10, wherein
the sub patterns are arranged on both sides of the main pattern, and
the numbers of the sub patterns are different in the adjacent divided layout regions.

12. The exposure mask of claim 10, wherein
when the layout region is in an XY plane, the layout region is divided into N units in an X direction, and
the sub patterns are symmetrically arranged in the X direction.

13. The exposure mask of claim 12, wherein
the layout region is divided into N units in an X direction such that the divided layout regions are symmetric in a Y direction, and
the layout regions symmetric in the Y direction of the divided layout regions are equal in distribution of attenuation amount of the exposure light.

14. The exposure mask of claim 10, wherein
the sub patterns arranged in the layout regions with three sides at end portions of the divided layout regions include:
first sub patterns that are arranged on two sides opposed to one another; and
second sub patterns that are arranged on the one remaining side and are smaller in number than the first sub patterns.

* * * * *